(12) United States Patent
Holmes et al.

(10) Patent No.: US 9,508,945 B2
(45) Date of Patent: Nov. 29, 2016

(54) SPECTRALLY TUNABLE BROADBAND ORGANIC PHOTODETECTORS

(71) Applicant: Regents of the University of Minnesota, Saint Paul, MN (US)

(72) Inventors: Russell J. Holmes, Chanhassen, MN (US); Richa Pandey, Boston, MA (US); Stephen Matt Menke, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 13/929,028

(22) Filed: Jun. 27, 2013

(65) Prior Publication Data

US 2014/0001455 A1    Jan. 2, 2014

Related U.S. Application Data

(60) Provisional application No. 61/665,153, filed on Jun. 27, 2012.

(51) Int. Cl.
  *H01L 51/05*   (2006.01)
  *B82Y 10/00*   (2011.01)
  *H01L 51/42*   (2006.01)
  *H01L 51/00*   (2006.01)
  *H01L 27/30*   (2006.01)

(52) U.S. Cl.
  CPC .......... *H01L 51/4246* (2013.01); *B82Y 10/00* (2013.01); *H01L 27/305* (2013.01); *H01L 27/302* (2013.01); *H01L 51/0046* (2013.01); *H01L 51/0078* (2013.01); *H01L 2251/308* (2013.01); *Y02E 10/549* (2013.01)

(58) Field of Classification Search
  CPC .......... H01L 51/0545; H01L 51/0036; H01L 51/0541; H01L 51/5012; B82Y 10/00
  USPC .......................................................... 257/40
  See application file for complete search history.

(56) References Cited

U.S. PATENT DOCUMENTS

| 5,342,451 | A * | 8/1994 | Virshup ................. 136/244 |
| 8,586,967 | B2 * | 11/2013 | Xue .................. B82Y 10/00 257/40 |
| 2002/0119297 | A1 * | 8/2002 | Forrest et al. ............. 428/199 |
| 2005/0110007 | A1 * | 5/2005 | Forrest .................. H01L 51/424 257/40 |
| 2005/0224113 | A1 * | 10/2005 | Xue et al. ................. 136/263 |
| 2006/0060239 | A1 * | 3/2006 | Peumans et al. ............ 136/263 |
| 2008/0224132 | A1 * | 9/2008 | Forrest et al. .............. 257/40 |
| 2010/0025663 | A1 * | 2/2010 | Sun et al. .................. 257/40 |
| 2010/0294351 | A1 * | 11/2010 | Holmes et al. .............. 136/255 |

(Continued)

OTHER PUBLICATIONS

Gregg and Hanna, "Comparing organic to inorganic photovoltaic cells: Theory, experiment, and simulation," J. Appl. Phys., 93(6): 3605-3614, Mar. 15, 2003.

(Continued)

*Primary Examiner* — Allen Parker
*Assistant Examiner* — Didarul Mazumder
(74) *Attorney, Agent, or Firm* — Fish & Richardson P.C.

(57) ABSTRACT

A photodetector device includes multiple organic photodetector subcells arranged in a stack, each organic photodetector subcell being configured to generate an electrical current in response to absorbing light over a corresponding range of wavelengths, in which each organic photodetector subcell includes at least one electron donor material and at least one electron acceptor material.

13 Claims, 16 Drawing Sheets

(56) References Cited

U.S. PATENT DOCUMENTS

| | | | |
|---|---|---|---|
| 2011/0012091 A1* | 1/2011 | Forrest et al. | 257/40 |
| 2011/0162697 A1* | 7/2011 | Sivananthan et al. | 136/255 |
| 2011/0204416 A1* | 8/2011 | Forrest et al. | 257/184 |

OTHER PUBLICATIONS

Hains and Marks, "High-efficiency hole extraction/electron-blocking layer to replace poly(3,4-ethylenedioxythiophene): poly(styrene sulfonate) in bulk-heterojunction polymer solar cells," Appl. Phys. Lett., 92: 023504-1-023504-3, Jan. 14, 2008.

Kim et al., "The effect of molybdenum oxide interlayer on organic photovoltaic cells," Appl. Phys. Lett., 95: 093304-1-093304-4, Aug. 31, 2009.

Pandey and Holmes, "Graded donor-acceptor heterojunctions for efficient organic photovoltaic cells," Adv. Mater., 22 (46):5301-5305, ePub Sep. 24, 2010.

Shrotriya et al., "Transition metal oxides as the buffer layer for polymer photovoltaic cells," Appl. Phys. Lett., 88, 073508-1-073508-3, ePub Feb. 16, 2006.

An et al., "Organic photodetector with spectral response tunable across the visible spectrum by means of internal optical microcavity," Org. Electron. 10, 1152-1157 (2009).

Arnold, "Broad Spectral Response Using Carbon Nanotube/Organic Semiconductor/C-60 Photodetectors," Nano Lett., 9(9):3354-3358 (2009).

Bailey-Salzman et al., "Near-infrared sensitive small molecule organic photovoltaic cells based on chloroaluminum phthalocyanine," Appl. Phys. Lett., 91, 013508, 3 pages, (2007).

Binda et al., "High detectivity squaraine-based near infrared photodetector with nA/cm(2) dark current" Appl. Phys. Lett., 98, 073303, 3 pages (2011).

Campbell, "Transparent organic photodiodes with high quantum efficiency in the near infrared," Appl. Phys. Lett., 97, 033303, 3 pages (2010).

Cho et al., "Electronic Structure of C60/Phthalocyanine/ITO Interfaces Studied using Soft X-ray Spectroscopies," J. Phys. Chem. C, 114:1928-1933 (2010).

Clifford et al., "Fast, sensitive and spectrally tuneable colloidal-quantum-dot photodetectors," Nat. Nanotechnol., 4, 40-44 (Nov. 2009).

Gong et al., "High-Detectivity Polymer Photodetectors with Spectral Response from 300 nm to 1450 nm," Science 325, 1665-1667 (Sep. 2009).

Hammond and Xue, "Organic heterojunction photodiodes exhibiting low voltage, imaging-speed photocurrent gain," Appl. Phys. Lett., 97, 073302, 3 pages (2010).

Kaneko et al., "Fast Response of Organic Photodetectors Utilizing Multilayered Metal-Phthalocyanine Thin Films," Jpn. J. Appl. Phys., vol. 42, Part 1, No. 4B, pp. 2523-2525 (Apr. 2003).

Lamprecht et al., "Spectrally selective organic photodiodes," Phys. Status Solidi-R (RRL) 2(4):178-180 (2008).

Menke, "Tandem organic photodetectors with tunable, broadband response," Appl. Phys. Lett., 101, 23301, 4 pages, (2012).

Morimune et al., "Photoresponse Properties of a High-Speed Organic Photodetector Based on Copper-Phthalocyanine Under Red Light Illumination," IEEE Photonic Tech. Lett., 18(24):2662-2664 (Dec. 2006).

Mutolo et al., "Enhanced open-circuit voltage in subphthalocyanine/C-60 organic photovoltaic cells," J. Am. Chem. Soc., 128, 8108-8109 (2006).

Ng et al., "Flexible image sensor array with bulk heterojunction organic photodiode," Appl. Phys. Lett. 92, 213303, 3 pages (2008).

Pandey et al., "Efficient Organic Photovoltaic Cells Based on Nanocrystalline Mixtures of Boron Subphthalocyanine Chloride and C60. Adv. Func. Mater.," 22, 617-624, (2011).

Pettersson, "Modeling photocurrent action spectra of photovoltaic devices based on organic thin films," J. Appl. Phys. 86, 487, (1999).

Peumans and Forrest, "Very-high-efficiency double-heterostructure copper phthalocyanine/C60 photovoltaic cells," Appl. Phys. Lett. 79(1): 126-128, (2001).

Peumans et al., "Efficient, high-bandwidth organic multilayer photodetectors," Appl. Phys. Lett., 76(26):3855-3857 (Jun. 2000).

Punke et al., "Dynamic characterization of organic bulk heterojunction photodetectors," Appl. Phys. Lett. 91, 071118, 3 pages (2007).

Reynaert et al., "Photomultiplication in Disordered Unipolar Organic Materials," Adv. Func. Mater., 16:784-790 (2006).

Yao et al., "Plastic near-infrared photodetectors utilizing low band gap polymer," Adv. Mater. 19, 3979-3983 (2007).

Zimmerman et al., "Porphyrin-Tape/C60 Organic Photodetectors with 6.5% External Quantum Efficiency in the Near Infrared," Adv. Mater, 22, 2780-2783 (2010).

\* cited by examiner

SPECTRALLY TUNABLE BROADBAND ORGANIC PHOTODETECTORS

CROSS-REFERENCE TO RELATED APPLICATIONS

This application claims priority to U.S. Provisional Application No. 61/665,153, filed Jun. 27, 2012, which is incorporated by reference in its entirety.

STATEMENT AS TO FEDERALLY SPONSORED RESEARCH

This invention was made with government support under DMR-0819885 awarded by the National Science Foundation. The government has certain rights in the invention.

BACKGROUND

An organic photodetector device is an electronic device that uses organic materials, such as conductive polymers or organic small molecules, to convert light into an electrical current. Organic photodetectors are a subset of organic photovoltaic devices that are optimized to respond electrically to an optical stimulus in order to sense light with high sensitivity. This is in contrast to organic solar cells where the objective is instead to generate useable electrical power from an optical input. Organic photodetectors have drawn interest for optical detection due to their potential compatibility with high throughput, roll-to-roll fabrication processes as well as low material cost. Conventional organic photodetectors often employ two active materials (electron donor and electron acceptor). The range of optical absorption for these materials determines the overall range of sensitivity for the photodetector.

SUMMARY

This disclosure relates to spectrally tunable broadband organic photodetectors and methods of making the same. In this disclosure, we present an architecture that can accommodate numerous optically absorbing donor-acceptor compounds using a stacked or tandem architecture in a single photodetector device structure. We show that the optical responsivity of the organic photodetector can be broadband, spanning the ultraviolet, visible, and near-infrared. Furthermore, we show that the response from each individual active compound material can be separately tuned, thereby achieving wide tunability in the optical responsivity of the organic photodetector. This tunability permits the responsivity spectrum of the photodetector to be tuned in wavelength and intensity depending on the requirements of the end application. This degree of tunability is not present or possible in other photodetector architectures.

In general, a novel aspect of the present disclosure can be embodied in a photodetector device that includes multiple organic photodetector subcells arranged in a stack, with each organic photodetector subcell being configured to generate an electrical current in response to light absorption over a corresponding range of wavelengths, in which each organic photodetector subcell includes at least one electron donor material and at least one electron acceptor material.

The foregoing and other embodiments can each optionally include one or more of the following features, alone or in combination. For example, in some implementations, an absorption spectrum of a first organic photodetector subcell in the stack overlaps with an absorption spectrum of a second organic photodetector subcell in the stack.

In some implementations, each organic photodetector subcell in the stack has an absorption spectrum that spans a different range of wavelengths.

In some implementations, one or more of the organic photodetector subcells in the stack includes a bi-layer structure having a uniform electron donor layer and a uniform electron acceptor layer. A spectral responsivity of the one or more subcells comprising a bi-layer structure may vary based on a property selected from the list consisting of a donor material thickness of the corresponding subcell, an acceptor material thickness of the corresponding subcell, and combinations thereof.

In some implementations, a first organic photodetector subcell in the stack includes a first electron donor material and a first electron acceptor in a mixture. A concentration of the first electron donor material or the first electron acceptor material may be graded from a first end of the first organic photodetector subcell to a second end of the first organic photodetector subcell. A first organic photodetector subcell in the stack may include a first electron donor material and a first electron acceptor material mixed in a first ratio, and a second organic photodetector subcell in the stack may include a second electron donor material and a second electron acceptor material mixed in a second different ratio. A ratio of the first electron donor material to the first electron acceptor material in the mixture may be 1:1.

In some implementations, the photodetector device further includes a buffer layer, such as an exciton blocking layer, an exciton injection layer, an electron injection layer, or an electron blocking layer (e.g., $MoO_3$).

In some implementations, each organic photodetector subcell is electrically and physically in direct contact with an adjacent organic photodetector subcell in the stack.

In some implementations, each organic photodetector subcell in the stack has a different spectral responsivity, the spectral responsivity of each subcell being a function of the subcell thickness.

In some implementations, each organic photodetector subcell has a different spectral responsivity, the spectral responsivity of each subcell being a function of the subcell donor material concentration.

In some implementations, each organic photodetector subcell has a different spectral responsivity, the spectral responsivity of each subcell being a function of the subcell acceptor material concentration.

In some implementations, a first organic photodetector subcell in the stack comprises a bi-layer structure having an a uniform electron donor layer and an a uniform electron acceptor layer, and a second organic photodetector subcell in the stack comprises a first electron donor material and a first electron acceptor in a mixture, the absorption spectrum of the first and second subcells being different.

In some implementations, the photodetector device does not include any recombination layers between subcells of the photodetector. Each subcell in the photodetector may be stacked in direct physical and electrical contact with an adjacent subcell in the stack.

In general, another novel aspect of the present disclosure can be embodied in a method of operating any of the photodetector devices disclosed herein under zero bias or a reverse bias to detect an amount of illumination incident on a face of the photodetector.

Unless otherwise defined, all technical and scientific terms used herein have the same meaning as commonly understood by one of ordinary skill in the art to which this invention belongs. Although methods, materials, and devices similar or equivalent to those described herein can be used in the practice or testing of the present invention, suitable methods, materials and devices are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more embodiments are set forth in the accompanying drawings and the description below. Other features and advantages will be apparent from the description, the drawings, and the claims.

DETAILED DESCRIPTION

Organic photodetector devices can be used over a range of wavelengths for converting an optical signal into an electrical current. In a basic bi-layer configuration, organic photodetectors contain two different active regions sandwiched between conductive electrodes. For the purposes of this disclosure, an active region is understood to be a region that generates excitons upon absorption of incident photons. The two active regions of materials have differences in electron affinity and ionization energy, producing an offset in the electronic energy levels at the interface between the two layers. For example, in some implementations, the region with larger (relative to a vacuum level) electron affinity and ionization potential is known as the electron acceptor layer, whereas the other region is known as the electron donor layer. Current can be produced from an organic photodetector when excitons that have been generated by light absorption diffuse toward and dissociate into electrons and holes at the donor-acceptor interface. Current can also be produced in an organic photodetector device when generated excitons are dissociated with an applied electrical field creating electrons and holes. The generated electrons and holes are collected at the conductive electrodes to generate a photocurrent. In contrast to solar cells, photodetector devices are operated under a zero bias or a reverse bias voltage to detect an amount of illumination on a face of the photodetector. In order to use the photodetector devices disclosed herein as photodetectors, the devices are operated under a reverse bias. A solar cell cannot be operated at zero bias or under reverse bias and still generate electrical power. The range of wavelengths over which photon absorption occurs depends on the materials selected for the donor and acceptor layers.

Figure 1A:
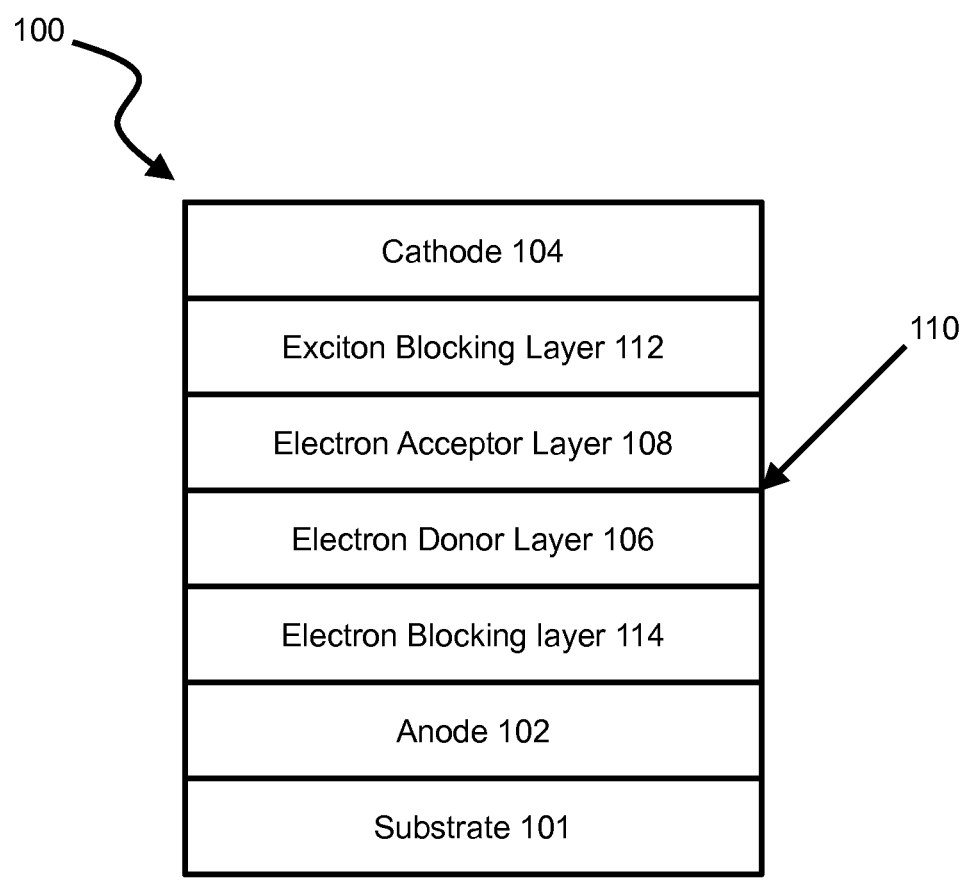
FIG. 1A is a schematic of an example organic photodetector device.

FIG. 1A is a schematic of an example of a bi-layer organic photodetector device. The organic photodetector device 100 includes a substrate 101, an anode 102, a cathode 104, a donor organic semiconductor layer 106 and an acceptor organic semiconductor layer 108. The donor layer 106 and acceptor layer 108 are layers of uniform donor and acceptor material, respectively. As explained above, photon absorption can lead to the formation of tightly bound, mobile electron-hole pairs known as excitons. Excitons generated in either the donor or acceptor layers 106, 108 diffuse to donor-acceptor (D-A) heterojunction interface 110 between the donor and acceptor layers. Due to differences in electron affinity and ionization energy between the donor layer 106 and acceptor layer 108, an energy level offset exists at the interface. If this offset exceeds the exciton binding energy (i.e., the energy required to bind the electron-hole pair together), the excitons can dissociate into electron and hole charge carriers. In organic photodetectors, excitons can also be dissociated with the application of an electric field. The application of an electric field also results in the formation of electron and hole charge carriers but does not require a D-A interface. Following dissociation, the electron and hole charge carriers can be collected at their respective electrodes.

Figure 1B:
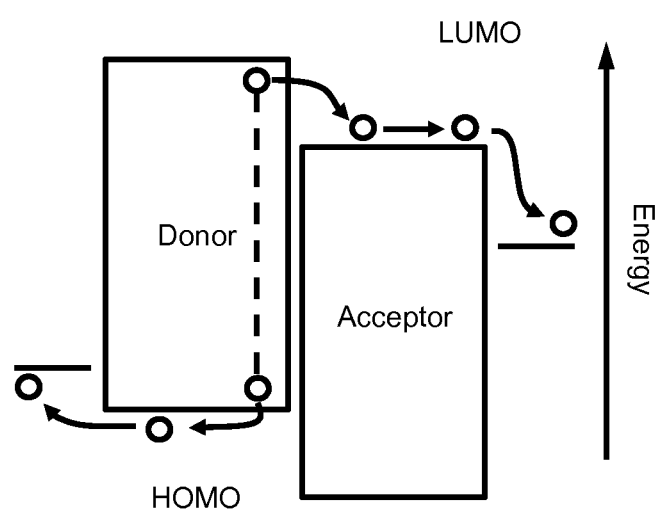
FIG. 1B is a schematic of the energy levels showing the LUMO and HOMO levels of a D-A interface, and the dissociation of an electron-hole pair at the interface.

The utilization of a D-A interface is important for organic active materials in order to efficiently dissociate the exciton to form free charge carriers when no electric field is applied. There must be sufficient energetic offset at the D-A interface between the highest occupied molecular orbitals (HOMOs) or the lowest unoccupied molecular orbitals (LUMOs) to overcome the exciton binding energy. FIG. 1B is a schematic of the energy levels showing the LUMO and HOMO levels of a D-A interface, and the dissociation of an electron-hole pair at the interface.

A D-A heterojunction can also be fabricated in architectures different than a simple planar interface between donor and acceptor films. For example, the D-A heterojunction can be formed as a mixture of electron donor material and electron acceptor material where the composition of the mixture is controlled. Depending on the chosen active layers, preferable donor:acceptor ratios include, for example, 10:1, 8:1, 4:1, 2:1, 1:1, 1:2, 1:4, 1:8, 1:10. Mixed heterojunctions are favorable, in some implementations, because they do not require materials with long exciton diffusion lengths. This is because intimate mixing of the D-A materials means that an exciton is never far from a D-A interface. The D-A heterojunctions can also be fabricated with a spatially graded composition profile where the composition of a D-A mixture gradually changes in a direction normal to the substrate. For example, the composition can gradually change from donor rich (e.g., 100% donor material) at a first end of a D-A subcell to acceptor rich (e.g., 100%) at a second end of the subcell. Further information on graded heterojunctions can be found in US Patent Application Publication No. 2010/0294351, incorporated herein by reference in its entirety. D-A heterojunctions also can include bulk heterojunctions where phase separation has occurred, leading to the creation of interpenetrating networks of donor and acceptor active material. Thermal or solvent annealing are common methods by which phase separation of organic semiconductors in bulk heterojunction is achieved. For the purposes of this disclosure, the bi-layer D-A heterojunction, mixed D-A heterojunction and graded D-A heterojunction are interchangeably referred to as D-A subcells.

The optional buffer layer 112 is an exciton blocking layer that can keep excitons formed in the topmost active layer from being quenched at the cathode interface. Excitons quenched at the cathode would not contribute to photocurrent from the device, so adding this layer improves performance but is not necessary. A wide energy gap material is favorable because the exciton blocking layer 112 preferably has a LUMO higher and a HOMO deeper than the adjacent electron acceptor material. This means that it is not favorable for excitons to dissociate at this interface. The exciton blocking layer 112 should also have an electron mobility great enough to allow electrons generated at the D-A interface to pass through the exciton blocking layer 112 and be collected at the cathode.

The other optional buffer layer 114 is an electron blocking layer and can keep electrons from entering the device to reduce the dark current of the device, which, in turn, increases the device photo-sensitivity. The electron blocking layer 114 can also help to limit photo-multiplication, which is a process that generates multiple charge carriers per single incident photon, resulting in quantum efficiencies over 100%. This effect will be discussed in greater detail later in this report. Other buffer layers may be used as well. For example, the device may include additional exciton and/or electron blocking layers. The device may include one or more electron and/or exciton injection layers.

Broadband Photodetectors

As explained above, the range of wavelengths over which photon absorption occurs depends, in part, on the materials selected for the electron donor and the electron acceptor. While a single donor-acceptor heterojunction cell can show broadband response, the spectral tunability of a single cell is intrinsically limited to the absorption profiles of the active materials in the layer. To increase the absorption range of an organic photodetector, the photodetector may be configured to include multiple D-A heterojunction subcells, in which each heterojunction subcell is separately tuned to have a different range of wavelengths over which photon absorption can occur based on manipulation of the subcell thickness and/or composition, such that the photodetector exhibits a broadband response. For example, each D-A heterojunction can be selected to have a different absorption band over the visible and near-infrared portions of the electromagnetic spectrum ($\lambda$=about 300 to over about 1000 nm). Multiple D-A heterojunctions in a single device may be chosen to provide complimentary absorption. These regions of complimentary absorption may be implemented in a multitude of combinations. For example, in some implementations, a broadband photodetector includes multiple stacked bi-layer D-A heterojunction pairs arranged in a single structure. This arrangement is also referred to as a multilayer organic photodetector. Stacking bi-layer D-A heterojunctions creates additional D-A interfaces where additional exciton dissociation can take place.

Figure 2:
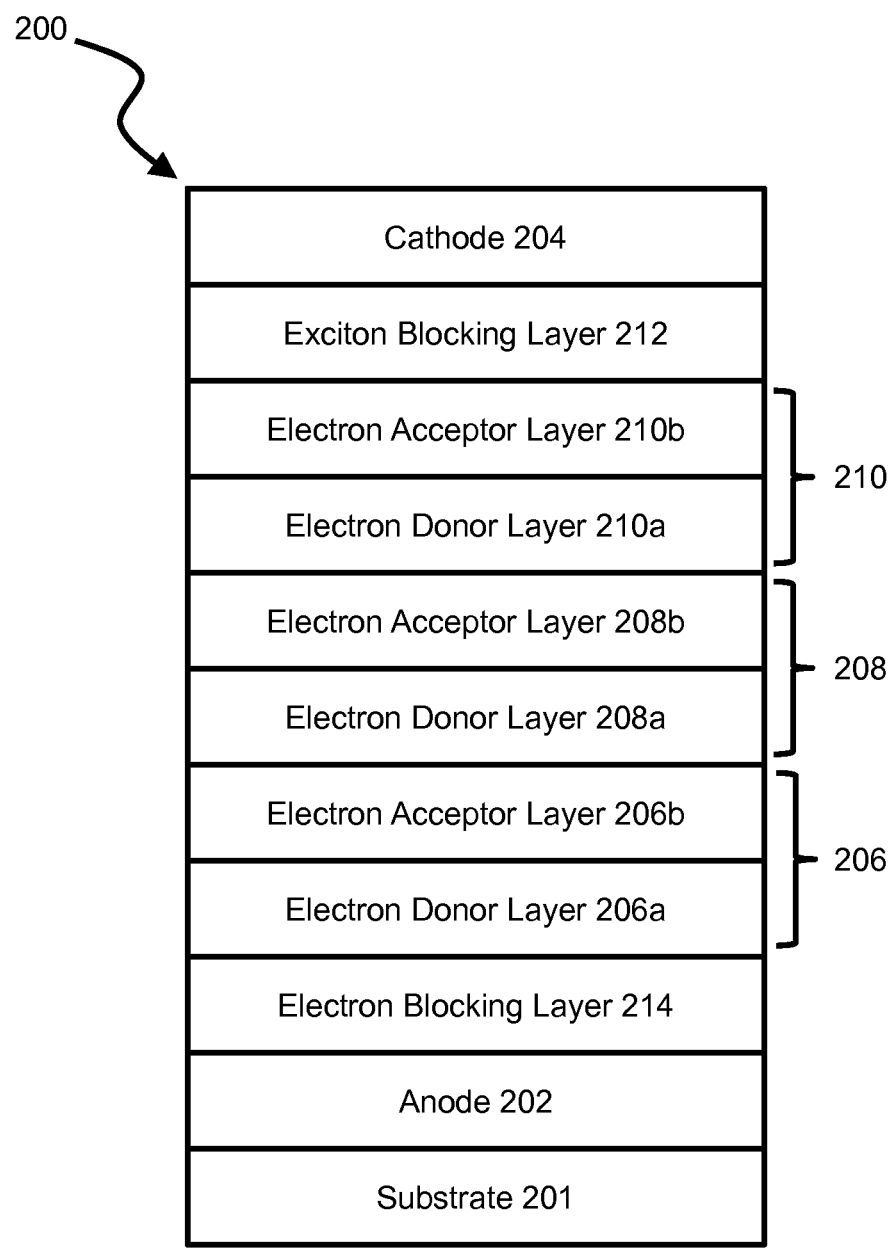
FIG. 2 is a schematic of an example broadband organic photodetector device having a multilayer structure.

An example of a broadband multilayer organic photodetector 200 having multiple bi-layer D-A heterojunctions is shown in FIG. 2. The organic photodetector 200 includes a substrate 201, an anode 202, a cathode 204, a first bi-layer D-A heterojunction subcell 206 having a first electron donor layer (EDL) 206a and a first electron acceptor layer (EAL) 206b, a second bi-layer D-A heterojunction subcell 208 having a second EDL 208a and a second EAL 208b, and a third bi-layer D-A heterojunction subcell 210 having a third EDL 210a and a third EAL 210b. The broadband organic photodetector 200 also may include an optional exciton blocking layer 212 and an optional electron blocking layer 214. Photon absorption in any of the donor or acceptor regions may lead to the formation of excitons. The excitons may diffuse to the D-A heterojunction interfaces of the subcell from which the excitons were generated or to the D-A interface created with the neighboring D-A heterojunction subcell. At both locations the excitons may then dissociate into electron and hole charge carriers. Following dissociation, the electron and hole charge carriers are collected at the electrodes. Each D-A subcell is electrically and physically in direct contact with an adjacent D-A subcell.

Each bi-layer D-A heterojunction subcell (206, 208, and 210) of the organic photodetector 200 may be configured to absorb photons over a different wavelength range. The absorption spectrum of the overall device is determined based on the combined absorption spectrum of the individual donor and acceptor materials, as well as the concentration of those materials. The range of wavelengths over which each subcell of the broadband organic photodetector responds is determined primarily by the materials selected for that subcell and any corresponding optical effects. The relative absorption of each wavelength can then be tuned based on a number of parameters (e.g., thickness, concentration uniformity and magnitude, positioning of subcells in the stack, and optical interference effects). For instance, the optical interference pattern across a range of wavelengths will determine the optical-electric field inside the device which directly determines relative absorption. The optical interference can be tuned by choosing appropriate layer thicknesses that can move the peaks of the optical electric field further or closer to a given layer, thus affecting that layers absorption relative to other layers.

In some implementations, the absorption bands of each donor material subcell may complement one another while the acceptor material is held constant (e.g., same acceptor material in each subcell). For example, for the bi-layer subcells shown in FIG. 2, the first electron donor layer 206a may be configured to generate excitons by absorbing photons over a range from about $\lambda_1$ to about $\lambda_2$, the second electron donor layer 208a may be configured to generate excitons by absorbing photons over a range from about $\lambda_2$ to about $\lambda_3$, and the third electron donor layer 210a may be configured to generate excitons by absorbing photons over a range from about $\lambda_3$ to about $\lambda_4$, where $\lambda_1 < \lambda_2 < \lambda_3 < \lambda_4$. The variation in the absorption bands may be due to a different electron donor material selected for each subcell. The electron acceptor layers of each subcell, on the other hand, may have the same acceptor material. Similarly, in some implementations, the electron donor material is held constant in each of the bilayer subcells, whereas the electron acceptor material is altered from one subcell to the next so as to tune each subcell to a different absorption spectrum. In some implementations, both the electron donor and acceptor material are varied from one subcell to the next to obtain a different absorption band for each subcell.

In some implementations, the absorption bands of the bi-layer D-A subcells may overlap. For example, the first electron donor layer 206*a* may be configured to generate excitons by absorbing photons over a range from $\lambda_4$ to $\lambda_5$ and the second electron donor layer 208*a* may be configured to generate excitons by absorbing photons over a range from $\lambda_6$ to $\lambda_7$, where $\lambda_4 < \lambda_6 < \lambda_5 < \lambda_7$. As before, the particular absorption bands for each electron donor layer may be determined based on the electron donor material chosen for that layer.

The absorption response of the photodetector device may also be modified by changing the number of D-A heterojunctions in the broadband photodetector. Example broadband organic photodetectors can include any suitable number of bi-layer D-A heterojunctions such as, for example, 2, 3, 4, 5, or 6. When additional bi-layer D-A heterojunctions, each having a different absorption response (e.g., a different absorption band), are added to the device, the overall absorption range of the photodetector increases. For example, the photodetector may include two D-A heterojunction subcells, each subcell covering an absorption band over a wide range of wavelengths. Alternatively, the photodetector may include more than two D-A heterojunction subcells, where each subcell covers a narrower absorption band, but the overall absorption band of the photodetector is the same as in the two subcell device.

In some implementations, the absorption response of the photodetector can be tuned by altering the total thickness of one or more bi-layer D-A heterojunctions within the photodetector stack, or the thickness of the donor layer or acceptor layer within each heterojunction subcell. For example, increasing the thickness of the electron donor material within one or more of the subcells may increase the absorption of photons over the absorption band supported by the electron donor material, whereas decreasing the thickness of the electron donor material would decrease the absorption of photons. Similarly, for electron acceptor materials, increasing the material thickness would increase the absorption over the wavelength band of the acceptor material, while decreasing thickness would decrease the absorption. Typically, thinner layers have less absorption and hence, less response. However, additional effects, such as the optical interference impact on the optical-electric field inside the device, and the efficiency of exciton diffusion and charge carrier collection, also modify the resulting response curve. In general, thicker layers will decrease the exciton diffusion and charge collection efficiencies resulting in lower electrical response, even though the absorption response of device/subcell has increased.

Figure 3A:
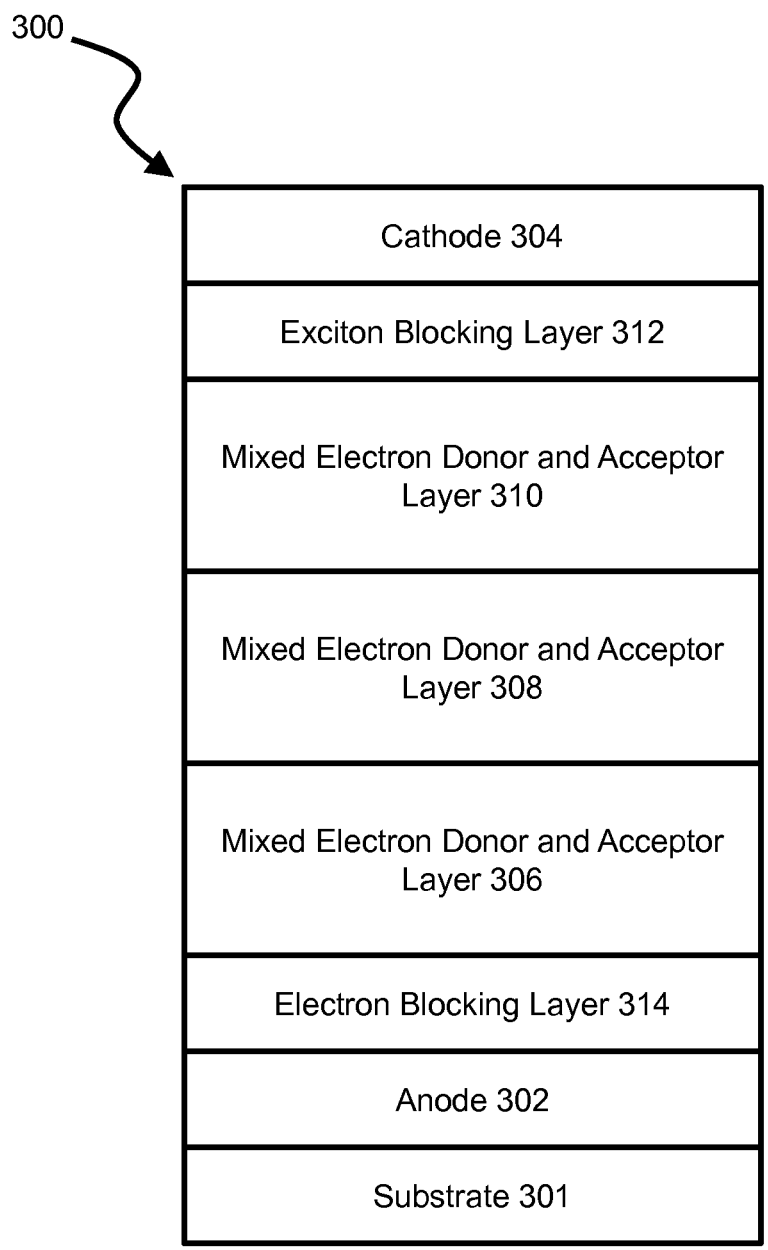
FIG. 3A is a schematic of an example broadband organic photodetector device having a mixed structure.

The D-A heterojunction subcells can be formed using configurations other than, or in addition to, the bi-layer design. For example, in some implementations, one or more of the D-A heterojunctions subcells of a broadband photodetector may be formed as a mixture. An example of a broadband organic photodetector 300 having multiple mixed D-A heterojunctions is shown in FIG. 3A. The organic photodetector 300 includes a substrate 301, an anode 302, a cathode 304, a first mixed D-A heterojunction 306 having a first electron donor material and a first electron acceptor material, a second mixed D-A heterojunction 308 having a second electron donor material and a second electron acceptor material, and a third mixed D-A heterojunction 310 having a third electron donor material and a third electron acceptor material. The broadband organic photodetector 300 can also include an exciton blocking layer 312 and an electron blocking layer 314, though both of these layers are not required for device operation. Excitons formed in each mixed D-A subcell diffuse to the heterojunctions formed between the electron acceptor and donor acceptor molecules of the mixture. The advantage of a mixed D-A heterojunction is that the photogenerated excitons do not have a long distance to diffuse before they can dissociate. This allows for higher photocurrents and optical responsivities to be achieved if materials with short exciton diffusion lengths are used. The electron donor and electron acceptor materials can be uniformly mixed in a D-A heterojunction. The electron donor material and electron acceptor material can be mixed in a D-A heterojunction in various ratios. For example, the donor-acceptor mixing ratio can be about 1:5, 1:4, 1:3, 1:2, 1:1, 2:1, 3:1, 4:1, or 5:1.

In some implementations, the concentrations of the electron donor material and electron acceptor material in a mixed D-A heterojunction are graded from a first end of the D-A heterojunction to a second opposite end of the D-A subcell. For example, the concentration of the electron donor material may increase from a non-zero or zero-concentration at the first end of the D-A heterojunction subcell to the second opposite end of the heterojunction subcell. Similarly, the concentration of the electronic acceptor material may increase from a non-zero or zero concentration at the second end of the D-A heterojunction subcell to the first end of the heterojunction subcell. The variation/gradient in concentration may have any applicable distribution. For example, the gradient may be linear or non-linear. The absorption response of mixed heterojunctions is generally material dependent since different material compositions may impact the diffusion and charge collection efficiencies in different ways. Ignoring such modifications to the diffusion and charge collection efficiencies, the absorption response of a mixed D-A heterojunction will be a linear combination of the substituent materials absorption response reflective of the mixing ratio for the layer.

Figure 3B:
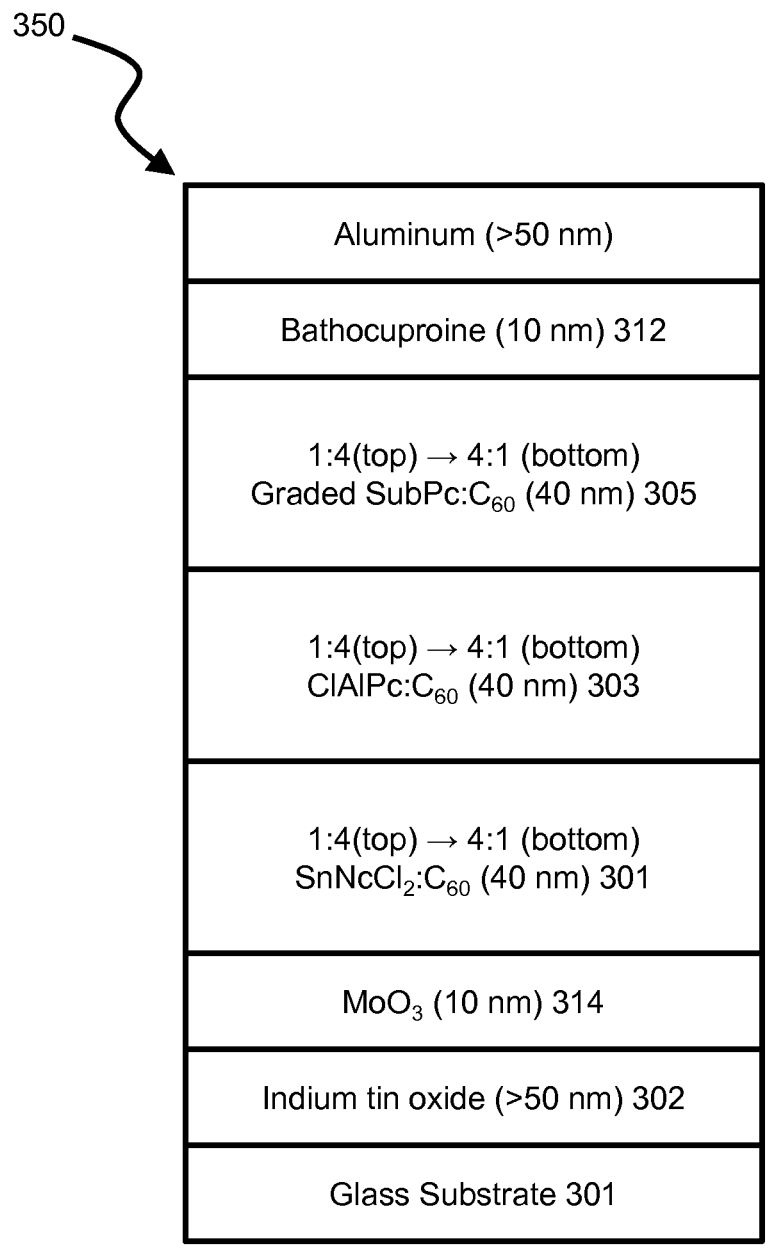
FIG. 3B is a schematic of an example of a broadband organic photodetector device having graded heterojunctions.

FIG. 3B is a schematic of an example of a broadband organic photodetector 350 having graded heterojunctions. The organic photodetector 350 includes a substrate 301, an anode 302 (e.g., indium tin oxide), a cathode 304 (e.g., aluminum), a first graded D-A heterojunction 301, a second graded D-A heterojunction 303, a third graded heterojunction 305, an exciton blocking layer 312 (e.g., bathocuproine) and an electron blocking layer 314 (e.g., $MoO_3$). The first graded heterojunction includes a mixture of $SnNcCl_2:C_{60}$ that is graded from a ratio of 1:4 $SnNcCl_2:C_{60}$ from the interface with the second graded heterojunction 303 to a ratio of 4:1 $SnNcCl_2:C_{60}$ at the interface with the electron blocking layer 314. The second graded heterojunction includes a mixture of $ClAlPc:C_{60}$ that is graded from a ratio of 1:4 $ClAlPc:C_{60}$ from the interface with the third graded heterojunction 305 to a ratio of 4:1 $ClAlPc:C_{60}$ at the interface with the first heterojunction layer 301. The third heterojunction 305 includes a mixture of $SubPc:C_{60}$ that is graded from a ratio of 1:4 $SubPc:C_{60}$ at an interface with the exciton blocking layer 312 to a ratio of 4:1 $SubPc:C_{60}$ at the interface with the second heterojunction layer 303. Heterojunction subcells having graded concentrations of donor and acceptor material are not limited to the materials shown in FIG. 3B and can include other compositions, as well.

Figure 11:
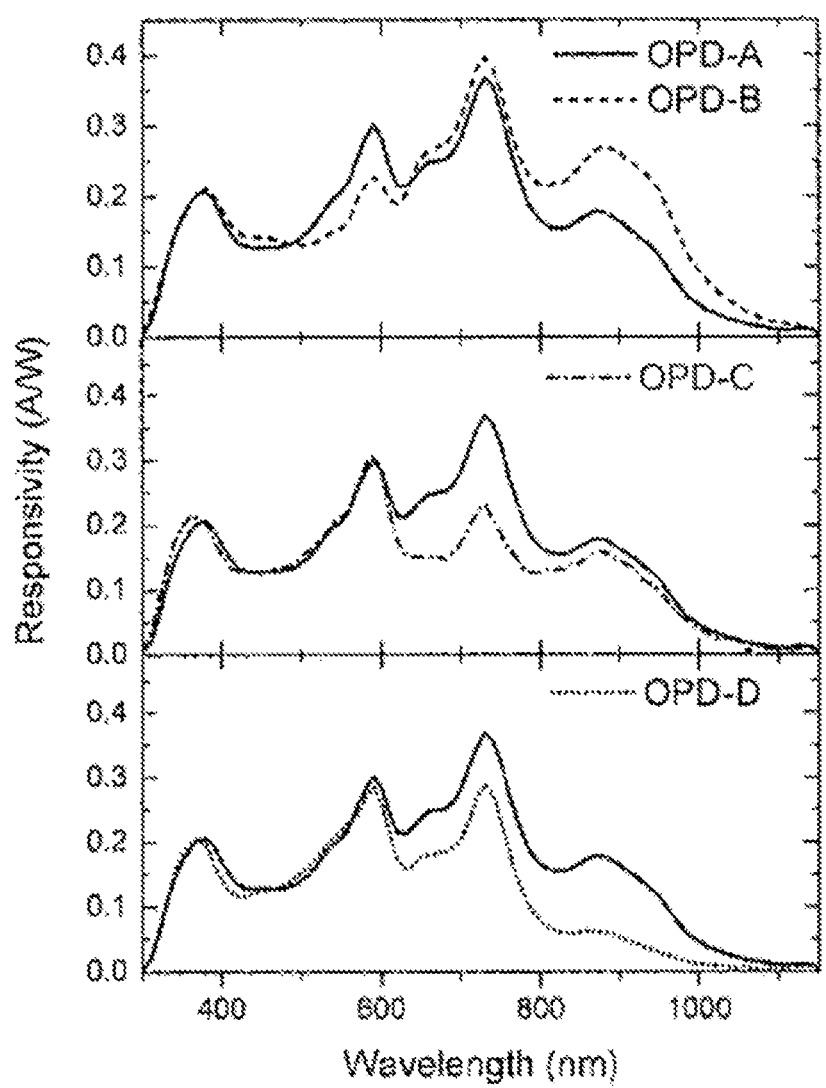
FIG. 11 is a plot of spectral responsivities for a set of photodetector devices.
Figure 14:
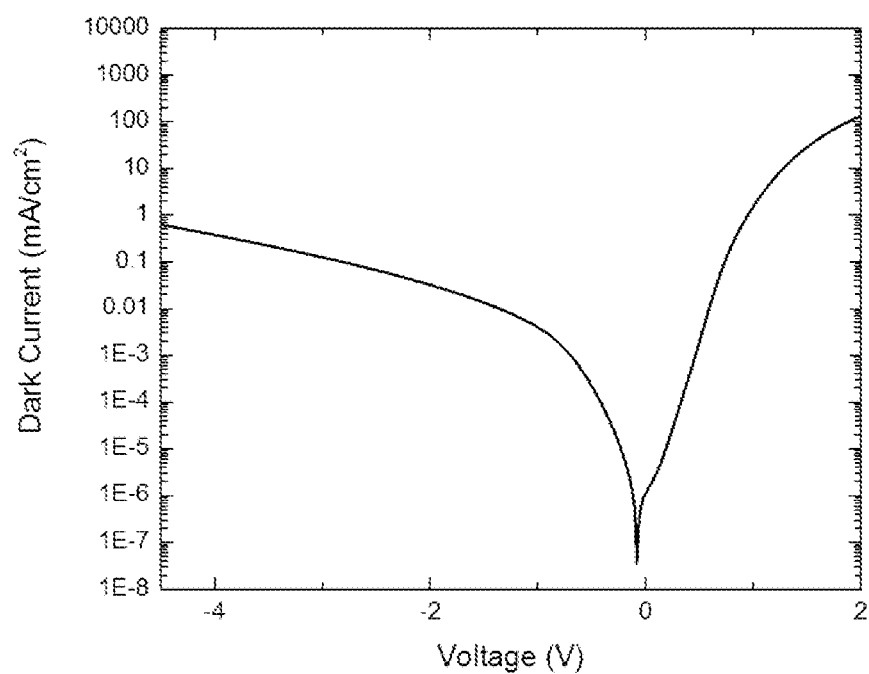
FIG. 14 is a plot of current versus voltage for a broadband organic photodetector containing a stack of mixed heterojunction subcells.

An unexpected result of stacked D-A subcells (e.g., bi-layer, mixed or graded subcells) is that even though these structures are constructed without a recombination layer between each subcell, the responsivity of such broadband photodetectors exhibit low leakage current and high sensitivity. In general, a recombination layer (e.g., a metal or metal oxide layer, such as a $MoO_x$ layer, a $WO_x$ layer, or a $VO_x$ layer) is understood by those of skill in the art to be a necessary component between active layers in a solar cell to provide a path of high resistance in order to limit leakage current and maintain high sensitivity in organic solar cell devices. Indeed, such recombination layers are crucial to the operation of solar cell devices, such that without them the solar cell device would fail to operate properly. However, the inventors of the present device have discovered that broadband photodetectors having multiple heterojunction subcells stacked on one another without recombination layers between the subcells (e.g., where each heterojunction subcell is stacked in direct physical contact with an adjacent heterojunction subcell) exhibit exceptional performance (e.g., low leakage current and high sensitivity). It is believed that, at least in the case of broadband organic photodetectors containing stacked mixed heterojunction subcells, the reason for the enhanced operating characteristics in the absence of recombination layers is due to the fact that the mixture of each subcell is resistive enough, by itself, to the transport of charge, such that there is a degree of self-balancing that keeps the leakage current below reasonable levels. Further, the application of reverse bias allows efficient carrier collection despite potential barriers to charge transport. This flexibility is not possible in a solar cell where there is no reverse bias to aid in charge collection, necessitating the recombination layers. Example spectral responsivities for various broadband photodetectors containing stacked mixed heterojunction subcells are shown in FIG. 11. Furthermore, FIG. 14 is a current-voltage plot for an experimentally fabricated broadband photodetector having multiple mixed heterojunction subcells. The device structure, from which the experimental values of FIG. 14 were obtained, was arranged in the following order: a 150 nm ITO anode layer/10 nm $MoO_3$ blocking layer/a 22 nm subcell containing a mixture of SubPc:C60/a 28 nm subcell containing a mixture of ClAlPc:C60/a 40 nm subcell containing a mixture of SnNcCl2:C60/a 10 nm BCP blocking layer/and a 65 nm Al cathode layer. No recombination layers were used between any of the subcells in the foregoing device structure. As FIG. 14 clearly shows, the device retains the on-off behavior of a diode, indicating that the use of recombination layers to inhibit leakage current is unnecessary in the broadband photodetector containing stacked mixed heterojunction subcells.

The mixed D-A heterojunctions are not limited to a single donor material and a single acceptor material. For example, in some implementations, a mixed D-A heterojunction can include two or more different types of electron donor material and/or two or more different types of acceptor material.

To achieve spectral tunability, apart from the selection of active materials, multiple strategies can be employed. As briefly noted above, these include: variation of a donor layer thickness, variation of acceptor layer thickness, variation of donor acceptor mixture thickness, variation of the composition in a donor-acceptor mixture, variation of graded donor acceptor layer thickness, variation of composition profiles in a graded donor acceptor heterojunction, variation of donor acceptor heterojunction ordering/stacking in the device, and manipulation of optical interference effects present in the device. Variation of the optical field in the device could be achieved by utilizing microcavity or nanocavity architectures that serve to engineer the confinement of light through either photonic or plasmonic effects. For example, the overall thickness between the cathode and anode can be designed such that the broadband photodetector acts as a cavity resonator that enhances the sensitivity of the device to a particular wavelength. The thickness for a particular wavelength, $\lambda$, can be determined using the equation for cavity resonators, $d=N\lambda/2$, where d is the thickness of the resonator and N is an integer. A broadband organic photodetector includes multiple heterojunction subcells, where the subcells are either bi-layer heterojunction subcells, mixed heterojunction subcells (e.g., graded heterojunction subcells), or some combination thereof.

For example, manipulating layer thicknesses changes the number of molecules in the device which can absorb light. Changing layer thicknesses also changes the optical interference pattern of the optical-electric field inside the device which is additionally determined by the optical constants of the layers, namely the index of refraction and extinction coefficient unique to the substituent materials. The same applies to the manipulation of mixture thicknesses, mixture compositions, graded layer thicknesses, and graded layer composition profiles. In some implementations, the device can be fabricated such that the active layers are inside a microcavity or nanocavity. These cavities are designed to generate large optical-electric fields inside the device, generally over a given wavelength range, resulting in increased absorption by substituents with absorption response overlapping with the wavelength range of the cavity. The wavelength range over which the cavity increases (or decreases) the optical electric field is determined by the quality factor of the cavity and the thickness of the cavity. In some implementations, introduction of a microcavity or nanocavity can be used the increase or decrease the absorption response for a given wavelength range imparting spectral tunability.

Further spectral tunability can be achieved with consideration of exciton diffusion and charge collection after the absorption of light. In addition to layer thicknesses and compositions, other factors that affect these properties are the energy levels of the overall photodetector device and the ordering of the subcells. For instance if an electron must travel through a region of the device with deeper LUMO energy levels than surrounding layers in order to be collected, this electron may be trapped in the layer with deeper LUMO energy levels. The trapping of electrons in this manner may decrease the charge collection efficiency for layers that generate electrons where such conditions hold and may reduce the electrical response in wavelength ranges corresponding to the layer where the electron was generated. The amount of trapping may depend on the difference in LUMO energy levels between the layers, the operation temperature of the device, as well as other factors not mentioned. The same discussion applies for photogenerated holes and the corresponding HOMO energy levels of the device. Furthermore, spectral tunability may then be achieved with proper selection of subcell ordering inside the photodetector device. This may have the effect of increasing or decreasing the collection efficiency of electron and hole charge carriers depending on the region of photo generation where the relative magnitude of the change is determined by the factors stated above.

Figure 4:
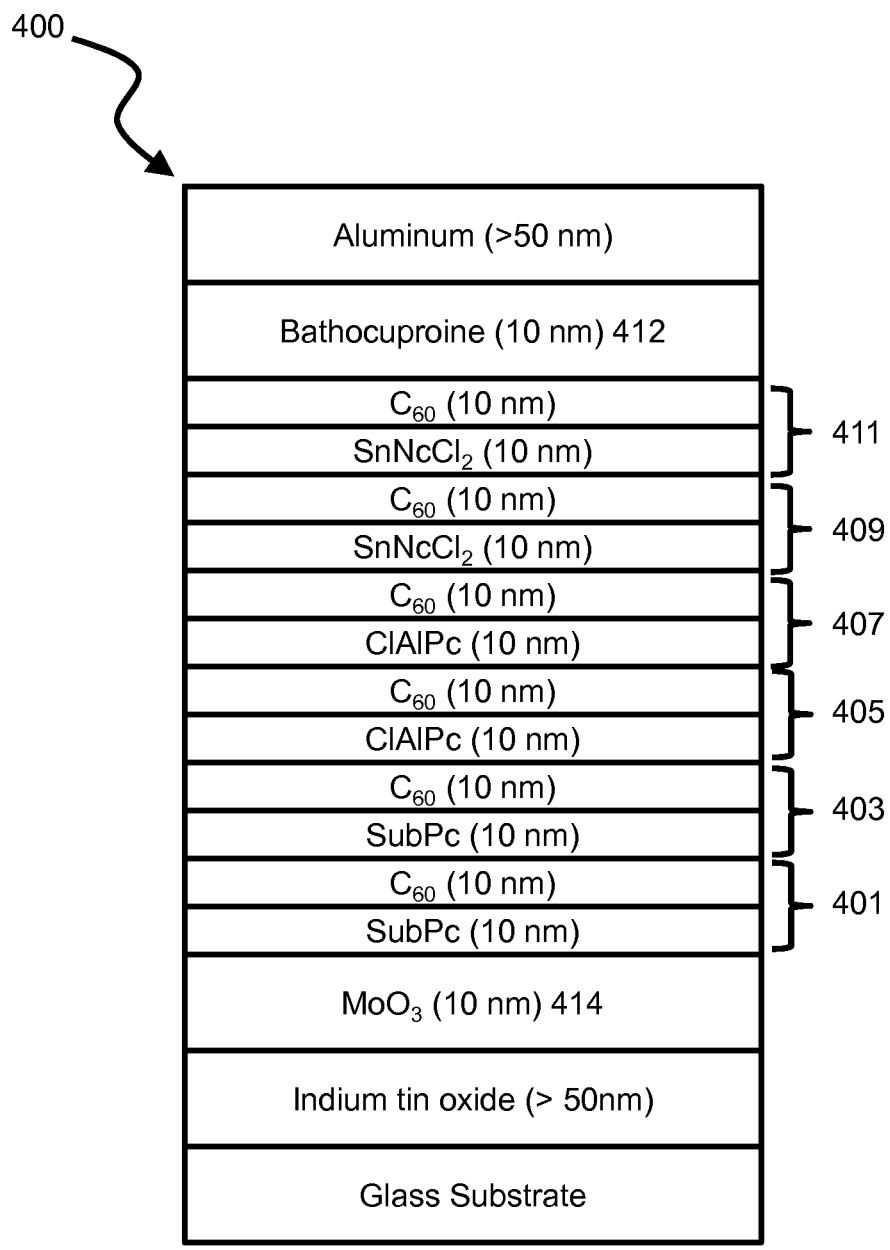
FIG. 4 is a schematic of an example broadband organic photodetector.

FIG. 4 is a schematic of an example broadband organic photodetector 400 fabricated to include six bi-layer D-A subcells (401, 403, 405, 407, 409, and 411) arranged in stack. The broadband organic photodetector 400 also includes an exciton blocking layer 412 and an electron blocking layer 414. Each heterojunction includes a bi-layer structure composed of an electron donor material and an electron acceptor material. For example, D-A heterojunctions 401 and 403 include carbon-60 ($C_{60}$) as the electron acceptor material and boron subphthalocyanine chloride (SubPc) as the electron donor material. D-A heterojunctions 405 and 407 include $C_{60}$ as the electron acceptor material and chloro-aluminum phthalocyanine (ClAlPc) as the electron donor material. D-A heterojunctions 409 and 411 include $C_{60}$ as the electron acceptor material and tin naphthalocyanine dichloride ($SnNcCl_2$) as the electron donor material. The thickness of each of these layers was 10 nm. Each of the active layer films in the device 400 was fabricated using vacuum thermal evaporation.

Figure 5:
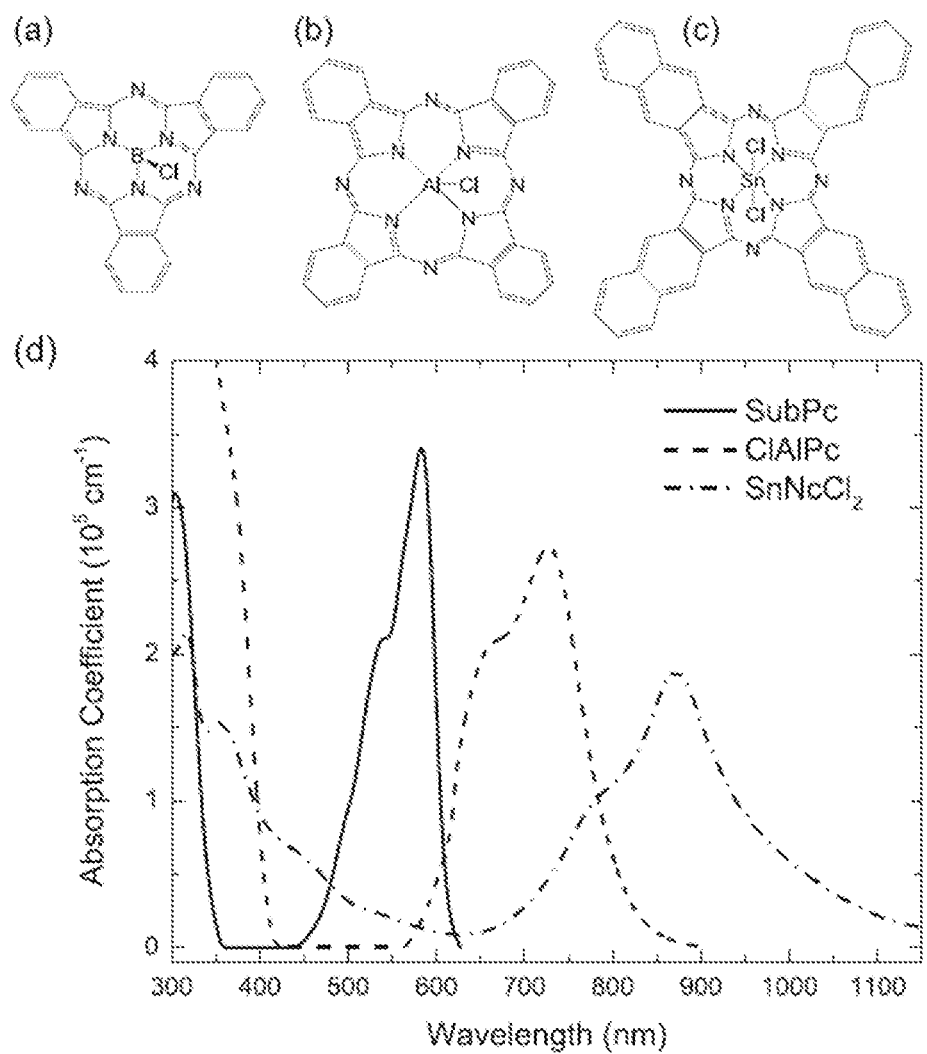
FIG. 5 is a schematic that shows the molecular structures for the electron donating materials (a) SubPc, (b) ClAlPc, (c) SnNcCl2, and (d) a plot of their respective absorption coefficients which span the ultraviolet to the near infrared.

In the above example, $C_{60}$, SubPc, ClAlPc, and $SnNcCl_2$ absorb light in the wavelength ranges of about 300-500 nm, about 500-610 nm, about 610-820 nm, and about 700-1100 nm, respectively. FIG. 5 shows the molecular structures for the electron donating materials (a) SubPc, (b) ClAlPc, (c) $SnNcCl_2$, and (d) a plot of their respective absorption coefficients which span the ultraviolet to the near infrared.

Figure 6:
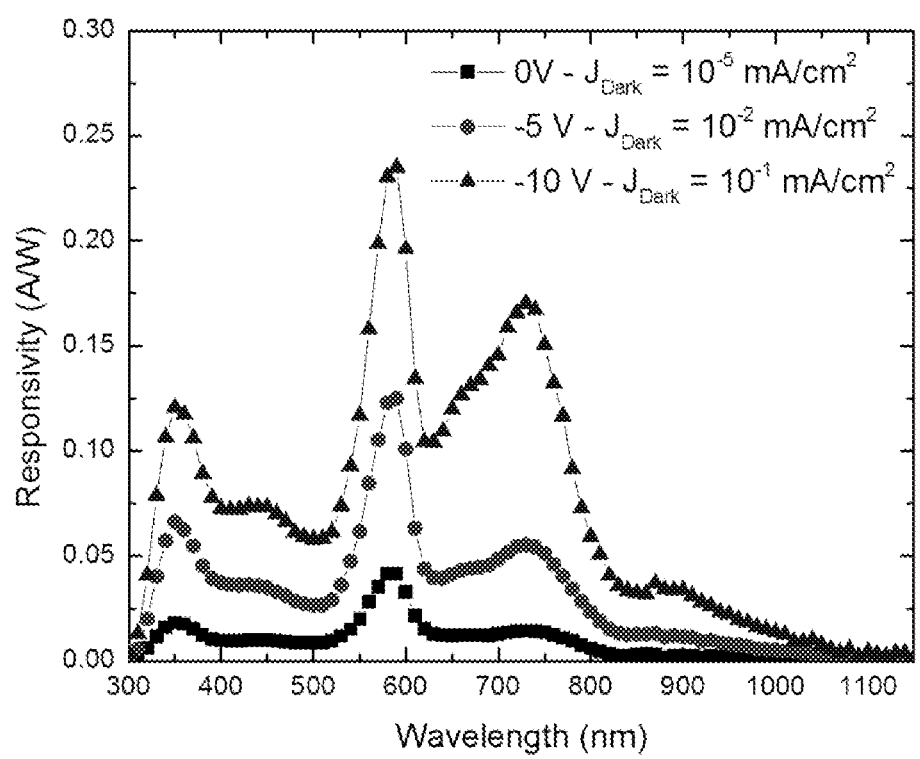
FIG. 6 is a plot of a spectral responsivity recorded for the device shown in the example of FIG. 4.

FIG. 6 is a plot of a spectral responsivity recorded for the device shown in the example of FIG. 4. Responsivity corresponds to the current generated by a device across a range of wavelengths of light normalized by the input optical power of the incident light. The responsivity was collected for the device at a number of reverse bias voltages. In general, applying a reverse bias voltage to a photodetector device can help to sweep charge carriers to the contacts and thereby increase the device sensitivity. As can be seen from the plot in FIG. 6, the responsivity of the device 400 contains three separate peaks located around 350 nm, 600 nm and 750 nm and 900 nm, corresponding to absorption on all of the materials in FIG. 5. The relative peak responsivity determined by the respective material can be tuned by any technique previously mentioned. The location of the relative peak absorption and spectral responsivity can be tuned by adjusting the type of donor/acceptor material being used in the device as well as any effects owing to optical interference.

Figure 7:
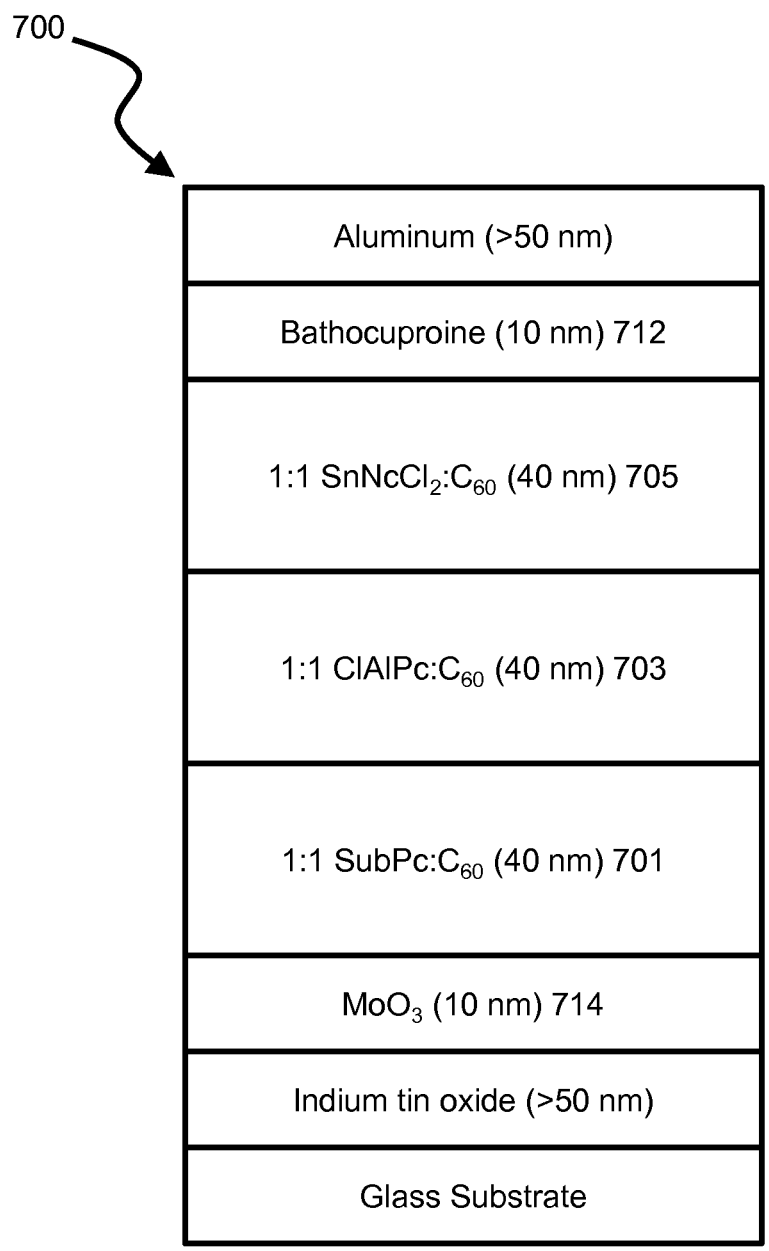
FIG. 7 is a schematic of an example broadband organic photodetector.
Figure 8:
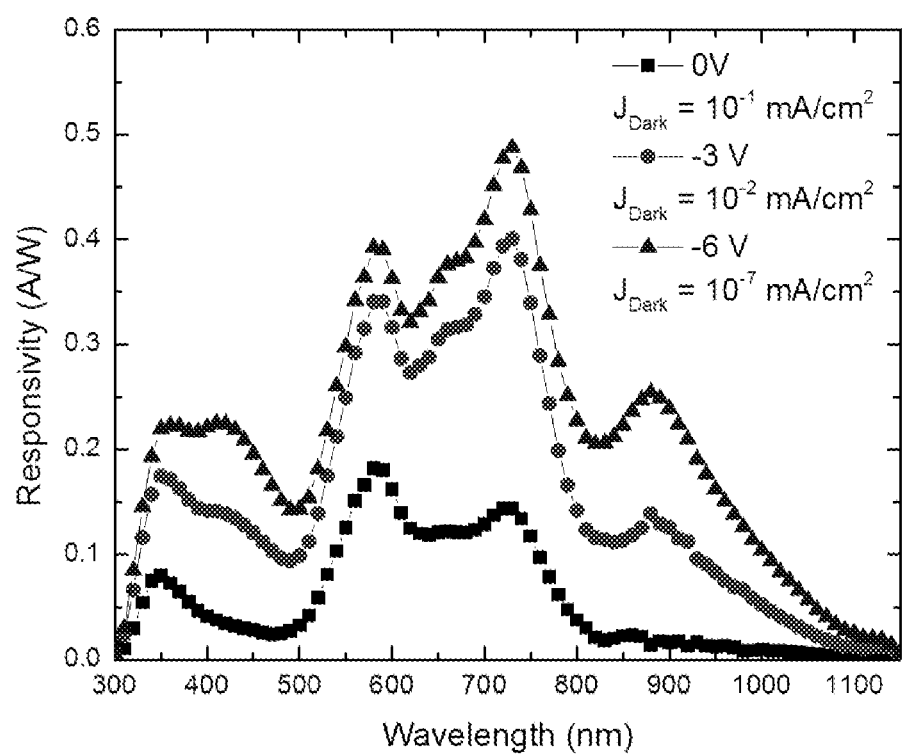
FIG. 8 is a plot of a spectral responsivity recorded for the device shown in the example of FIG. 7.

FIG. 7 is a schematic of an example broadband organic photodetector 700 fabricated to include mixed composition active layers. In particular, organic photodetector 700 has a first mixed D-A heterojunction subcell 701 that includes a mixture of SubPc donor material and $C_{60}$ acceptor material in a 1:1 concentration ratio. A second mixed D-A heterojunction subcell 703 includes a mixture of ClAlPc donor material mixed with $C_{60}$ acceptor material in a ratio of 1:1. A third D-A heterojunction 705 includes $SnNcCl_2$ donor material in a 1:1 mixture with $C_{60}$ acceptor material. The thickness of each D-A subcell was about 40 nm. The broadband organic photodetector 700 also included an exciton blocking layer 712, using bathocuproine (BCP), and an electron blocking layer 714, using molybdenum oxide ($MoO_3$). A spectral response recorded for the photodetector 700 is shown in FIG. 8. One to one compositions were selected in order to give a direct comparison to the multilayer device. A higher responsivity is recorded for this device as a larger fraction of photogenerated excitons can be dissociated using a mixed D-A architecture. The weaker dependence on reverse bias is attributed to more efficient charge collection in a mixed D-A architecture as compared to the multilayer device.

In all device combinations presented hereto, there is also a possibility of photomultiplicative gain. For the purposes of this disclosure, photomultiplicative gain is understood as the generation of more than one pair of electron and hole charge carriers per incident photon, resulting in external quantum efficiencies greater than 100%. Photomultiplicative gain can be caused by the buildup of charge carriers within the device at interfaces or in the bulk leading to the creation of photogenerated electric fields that inject additional charge carriers into and across the device. This effect is exacerbated under reverse bias which is used to help extract carriers. Photomultiplicative gain can sometimes be suppressed with the addition of charge carrier blocking layer which hinders the injection of charges from the anode or cathode. Photomultiplication can be enhanced with rearrangement of the heterojunction ordering as well as with the addition of blocking layers that trap photogenerated charge carriers within the device. While photomultiplication increases the responsivity of the device it also slows the device response time.

Figure 9:
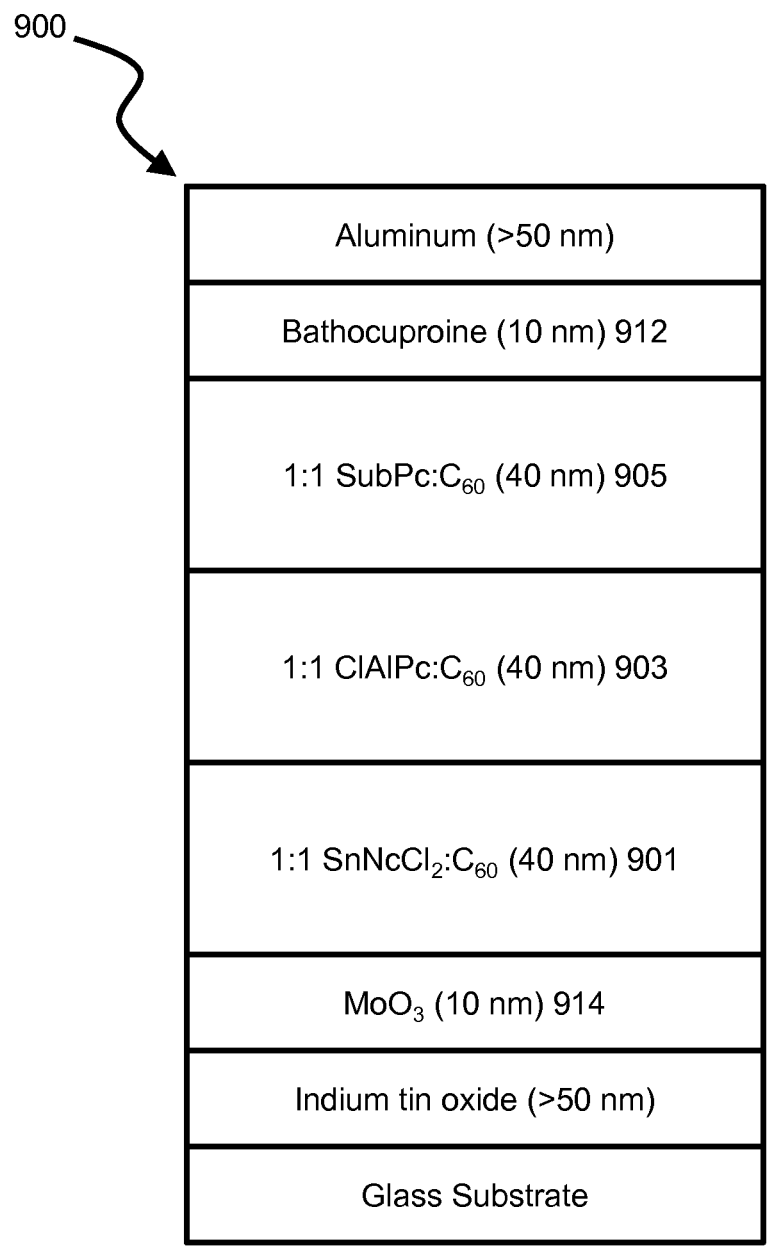
FIG. 9 is a schematic of an example organic photodetector.
Figure 10:
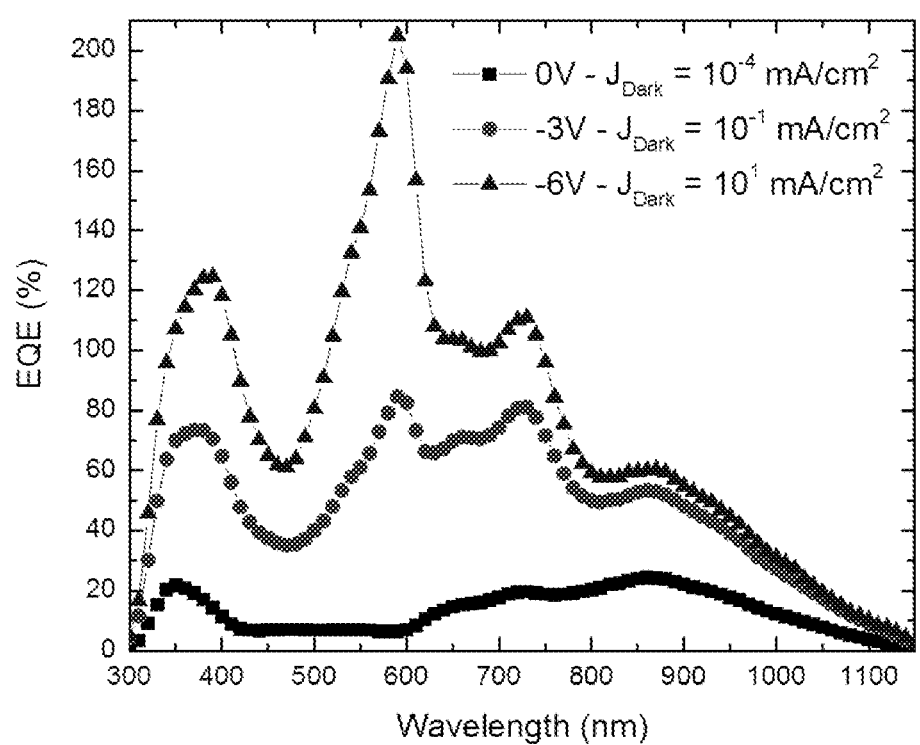
FIG. 10 is a plot of external quantum efficiency for the device shown in the example of FIG. 9.

FIG. 9 is a broadband organic photodetector that shows photomultiplicative gain achieved by rearranging the ordering of the mixed D-A heterojunctions. In particular, organic photodetector 900 has a first mixed D-A heterojunction subcell 901 that includes a mixture of $SnNcCl_2$ donor material and $C_{60}$ acceptor material in a 1:1 concentration ratio. A second mixed D-A heterojunction subcell 903 includes a mixture of ClAlPc donor material mixed with $C_{60}$ acceptor material in a ratio of 1:1. A third mixed D-A heterojunction subcell 905 includes SubPc donor material in a 1:1 mixture with $C_{60}$ acceptor material. The thickness of each D-A subcell was about 40 nm. The broadband organic photodetector 900 also included an exciton blocking layer 912, using bathocuproine (BCP), and an electron blocking layer 914, using molybdenum oxide ($MoO_3$). The external quantum efficiency for this device is shown in FIG. 10. Note that the external quantum efficiency greater than 100% signals photomultiplication.

In order to demonstrate spectral tunability, a series of devices were fabricated with identical layer structures as the device in FIG. 7. Here, mixed D-A heterojunction layer thickness was used to impart tunability. Table 1 below summarizes the mixed D-A heterojunction thicknesses for the set of devices.

TABLE 1

| Device | Mixed D-A Heterojunction Thickness (nm) | | |
|---|---|---|---|
| | SubPc:$C_{60}$ | ClAlPc:$C_{60}$ | SnNcCl$_2$:$C_{60}$ |
| Control (OPD-A) | 22 | 28 | 40 |
| Half SubPc:$C_{60}$ (OPD-B) | 11 | 28 | 40 |
| Half ClAlPc:$C_{60}$ (OPD-C) | 22 | 14 | 40 |
| Half SnNcCl$_2$:$C_{60}$ (OPD-D) | 22 | 28 | 20 |

The thicknesses for the electron blocking layer, exciton blocking layer, indium tin oxide, and Al cathode were held constant with respect to the device in FIG. 7. The layer thicknesses for the control device were selected as to have similar optical densities. The following three devices then represent a set structures where the mixed D-A heterojunction thicknesses were systematically halved. The spectral responsivities for the devices of Table 1 are shown in FIG. 11. As shown in the figure, simply changing the thickness of a given mixed D-A heterojunction has the effect of reducing the optical responsivity in the respective region of optical absorption. Other strategies for achieving spectral tunability also can be employed such as, for example, selecting different active materials in one or more D-A subcells, varying the composition of the donor and acceptor materials in a donor acceptor mixture, or varying the D-A subcell ordering/stacking in the device, among other things.

Figure 12:
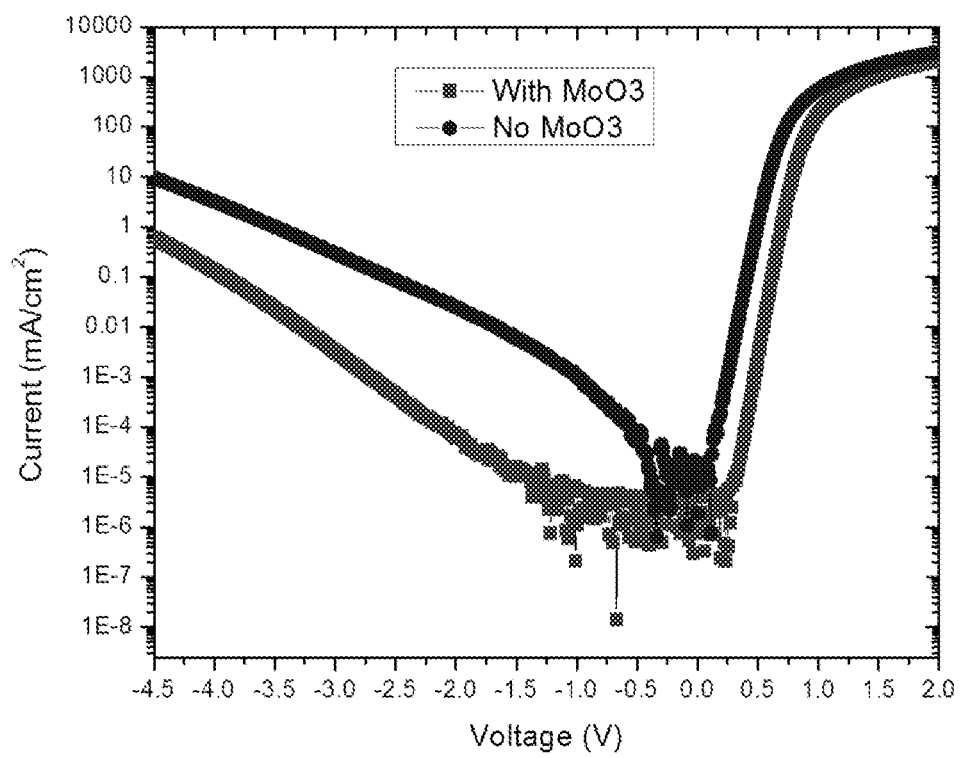
FIG. 12 is a plot of current versus voltage for a broadband organic photodetector containing a stack of heterojunction subcells with a buffer layer (e.g., electron blocking layer) and a broadband organic photodetector containing a stack of heterojunction subcells without a buffer layer.

For the broadband organic photodetectors fabricated in the examples of FIGS. 4, 7, 9, and 11, a thin (~10 nm) layer of molybdenum oxide ($MoO_3$) was incorporated as an electron blocking layer (414 in FIG. 4, 714 in FIG. 7, and 914 in FIG. 9). The $MoO_3$ layer serves to limit photomultiplication and reduce dark current. The addition of such a layer is optional as is not required for organic photodetector operation. FIG. 12 is a plot of dark current for a broadband organic photodetector device fabricated to include a $MoO_3$ electron blocking layer compared to a similar broadband organic photodetector device without the electron blocking layer. As shown in the plot, the addition of the $MoO_3$ layer reduced the dark current and thus can improve the sensitivity of the device. The structure of the device used to obtain the experimental results of FIG. 9 was similar to the arrangement of the broadband organic photodetector device 400, except that the thickness of the ClAlPc layers was 5 nm, the thickness of the $C_{60}$ layers was 15 nm, the thickness of the SubPc layers was 5 nm, and no $SnNcCl_2$ was present.

Various materials can be used to form the different layers of a broadband photodetecting device. For example, the cathode of a broadband photodetector generally is composed of a material having a small work function while the anode is generally composed of a material having a large work function. The cathode can include materials such as, for example, Al, Ag, Li, Cs, or combinations of thereof. In some implementations, the cathode material can be combined with halide salts including, for example, CsF or LiF, among others. The anode can be composed of materials such as, for example, Au, indium tin oxide (ITO), fluorinated tin oxide, or zinc oxide, or combinations thereof. In some implementations, the anode and/or cathode include organic or nanostructure materials such as, for example, carbon nanotubes, metallic nanowires or conjugated polymers. Other materials for the anode and/or cathode may be used as well.

The donor and/or acceptor materials can include organic semiconductors such as, for example, phthalocyanines, subphthalocyanines, naphthalocyanines, rubrenes, indenes, linear acenes (e.g., tetracene), metallocenes (e.g., ferrocene), naphthalenes, perylenes and fullerenes (e.g., $C_{60}$ or $C_{70}$), among others. In some implementations, multiple donor or acceptor layers may be included in a single subcell. In some implementations, donor and acceptor material can include polymeric organic semiconductors such as, for example, polythiophenes (P3HT), fullerene derivatives (PCBM), and polyvinylidenes. In some implementations, the donor and/or acceptor material can include nanomaterials such as inorganic semiconductor nanoparticles. For example, the nanomaterials used in the donor and/or acceptor material can include group IV, group II-VI, group III-V, group IV-IV, or group IV-VI inorganic materials, such as silicon, tellurides, sulfides, among others.

The exciton blocking layer can be formed, for example, from wide energy gap materials such as, for example, bathocuproine and bathophenanthroline, among others. The electron blocking layers can be formed, for example, from $MoO_3$, vanadium oxide, poly(3,4-ethylenedioxythiophene): poly(styrene sulfonate) (PEDOT:PSS), and Tris(phenylpyrazole)iridium ($Ir(ppz_3)$), among others.

Figure 13:
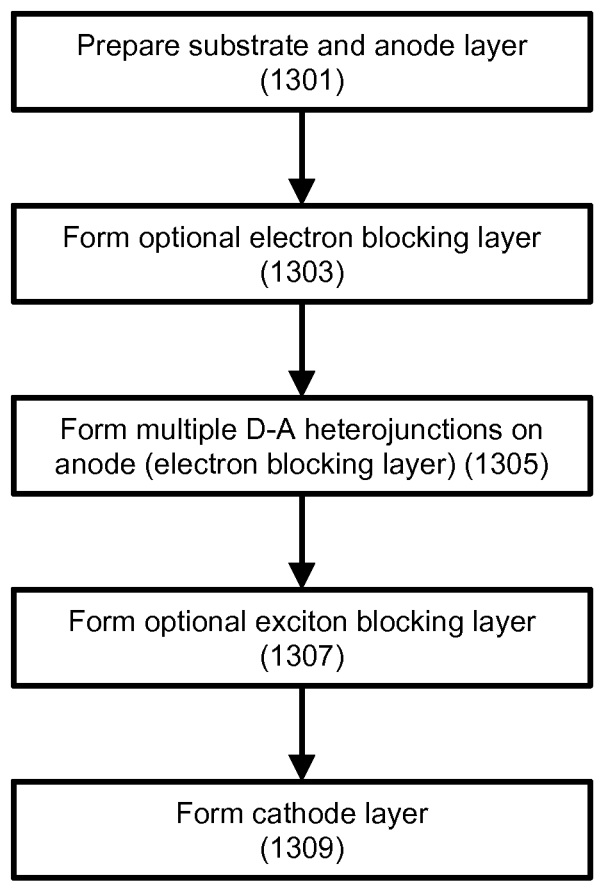
FIG. 13 is a flow chart of an example process for fabricating a broadband organic photodetector.

FIG. 13 is a flow chart depicting an example process for fabricating a broadband organic photodetector. As shown in FIG. 13, fabrication of the broadband organic photodetector can begin by preparing a substrate for deposition followed by forming (1301) the organic photodetector anode layer. In an example, a glass-slide is used as a substrate and is prepared by sonication in a tergitol solution for about 5 minutes, in de-ionized water for about 5 minutes, and twice in acetone for about 5 minutes each time. The glass-slide then is boiled twice in isopropyl alcohol for about 5. To fabricate the anode layer, an electrically conductive layer then is formed on the substrate. For example, a layer of ITO having a sheet resistance of 15Ω/☐ can be deposited on the glass-slide using thermal evaporation or radio-frequency (RF) sputtering, although alternative deposition techniques may be used as well. In some implementations, the substrate is pre-coated with the electrically conductive layer. For example, the glass slide is pre-coated with a layer of ITO prior to the foregoing cleaning steps. The coated ITO glass slide is then exposed to ultraviolet-ozone ambient for about 5 minutes. Transparent or non-transparent conductive material other than ITO, such as, for example, gold or aluminum, also may be deposited as the anode layer.

The optional electron blocking layer, multiple D-A heterojunctions, and the optional exciton blocking layer are then formed on the anode layer (1303, 1305, and 1307). To form these layers, the electron blocking, exciton blocking, donor, and acceptor materials can be deposited as individual layers (e.g., for bi-layer heterojunctions) using, for example, high-vacuum thermal evaporation. For D-A mixtures, the organic materials also can be co-deposited using the high-vacuum thermal evaporation technique. For example, the organic materials can be deposited at about $8 \times 10^{-7}$ Torr. The growth rate of the layers, whether containing homogeneous electron and donor material or mixtures, can be measured using a quartz crystal monitor. For growing an active layer in which the composition of the constituent materials is graded, two different material sources in the chamber can be used. The deposition rate of each material is computer controlled permitting the growth of films with compositions which vary over the film thickness. In some implementations, the gradients of the donor and acceptor material concentration are characterized by the corresponding material growth rate. In an example, a mixed D-A subcell can be formed with SubPc and $C_{60}$ in which the growth rate of SubPc is gradually decreased from 2 Å/s at the beginning of the deposition process to 0 Å/s at the end of the deposition process. In contrast, the growth rate of $C_{60}$ is 0 Å/s at the beginning of the deposition process and 2 Å/s at the end of the deposition process. Alternatively, in some implementations, the deposition rate of the donor and acceptor material is kept constant while a substrate holder, which holds the device being fabricated, is moved from one side of the growth chamber near the first material source to a second side of the growth chamber near the second material source. In this way, the growth rate of the donor and acceptor material is adjusted by changing the speed at which the substrate holder moves.

If additional types of donor or acceptor material are desired in the active layer, additional material sources may be added to the source chamber. Deposition techniques other than high-vacuum thermal evaporation also may be used. For example, deposition techniques including, but not limited to, solution deposition, sublimation, vapor-phase deposition, vapor-jet deposition, or molecular-beam deposition may be used to deposit the organic material employed in the broadband organic photodetector. Multiple heterojunctions subcells are formed, in which properties of those subcells, such as thickness, donor concentration, or acceptor concentration are varied to achieve the desired spectral responsivity (e.g., the desired absorption band) for each subcell.

Following the deposition of the active layers, a cathode can be deposited (1309) on the surface of the device. The cathode layer can be deposited using any of various deposition techniques including, but not limited to, thermal evaporation an RF sputtering.

In some implementations, one or more optional interlayers may be formed in contact with the active layers. The one or more interlayers include, for example, a charge blocking layer, a charge transport layer, or any combination thereof. The interlayer may be formed of organic or inorganic material and can be deposited using any of various deposition techniques including, but not limited to, deposition from solution, thermal evaporation, sublimation, RF sputtering, vapor-phase deposition, vapor-jet deposition, and molecular-beam deposition. The interlayer or charge recombination layer is optional in the devices discussed here. This is in contrast to the case of organic solar cells where this layer is critical in order to obtain voltage addition between cells, a required result for high efficiency in these devices. Additional information regarding fabrication and deposition for organic photodetector devices can be found in US Patent Application Publication No. 2010/0294351, incorporated herein by reference in its entirety.

A number of embodiments have been described. Nevertheless, it will be understood that various modifications may be made without departing from the spirit and scope of the invention. Other aspects, advantages, embodiments and modifications are within the scope of the following claims.

What is claimed is:

1. A photodetector device comprising:
a plurality of organic photodetector subcells arranged in a stack, each organic photodetector subcell being configured to generate an electrical current in response to absorbing light over a corresponding range of wavelengths,
wherein each organic photodetector subcell comprises a photoactive region composed of an intimate mixture of at least one electron donor material and at least one electron acceptor material, and wherein the photoactive region of each organic photodetector subcell in the stack is in direct physical contact with the photoactive region of at least one other organic photodetector subcell in the stack.

2. The photodetector device of claim 1, wherein an absorption spectrum of a first organic photodetector subcell in the stack overlaps with an absorption spectrum of a second organic photodetector subcell in the stack.

3. The photodetector device of claim 1, wherein each organic photodetector subcell in the stack has an absorption spectrum that spans a different range of wavelengths.

4. The photodetector device of claim 1, wherein a concentration of a first electron donor material or a first electron acceptor material in a first organic photodetector subcell is graded from a first end of the first subcell to a second end of the first organic photodetector subcell.

5. The photodetector device of claim 1, wherein a first organic photodetector subcell in the stack is composed of a first electron donor material and a first electron acceptor material mixed in a first ratio, and a second-organic photodetector subcell in the stack is composed of a second electron donor material and a second electron acceptor material mixed in a second different ratio.

6. The photodetector device of claim 1, wherein a first organic photodetector subcell is composed of a first electron donor material and a first electron acceptor material, and a ratio of the first electron donor material to the first electron acceptor material in the mixture is 1:1.

7. The photodetector device of claim 1, further comprising a $MoO_3$ electron blocking layer.

8. The photodetector device of claim 1, wherein each organic photodetector subcell is electrically and physically in direct contact with an adjacent organic photodetector subcell in the stack.

9. The photodetector device of claim 1, wherein each organic photodetector subcell in the stack has a different spectral responsivity, the spectral responsivity of each subcell being a function of the subcell thickness.

10. The photodetector device of claim 1, wherein each organic photodetector subcell has a different spectral responsivity, the spectral responsivity of each organic photodetector subcell being a function of the subcell donor material concentration.

11. The photodetector device of claim 1, wherein each organic photodetector subcell has a different spectral responsivity, the spectral responsivity of each organic photodetector subcell being a function of the subcell acceptor material concentration.

12. A photodetector device comprising:
a plurality of organic photodetector subcells arranged in a stack, each organic photodetector subcell being configured to generate an electrical current in response to absorbing light over a corresponding range of wavelengths,
wherein each organic photodetector subcell is composed of an intimate mixture of at least one electron donor material and at least one electron acceptor material, and wherein there is no recombination layer or electrode layer between adjacent organic photodetector subcells in the stack, and
wherein each organic photodetector subcell in the stack is in direct physical contact with at least one other organic photodetector subcell in the stack.

13. A photodetector device comprising:
a plurality of organic photodetector subcells arranged in a stack, each organic photodetector subcell being configured to generate an electrical current in response to absorbing light over a corresponding range of wavelengths,
wherein each organic photodetector subcell is composed of an intimate mixture of at least one electron donor material and at least one electron acceptor material, and wherein each organic photodetector subcell in the stack is in direct physical contact with at least one other organic photodetector subcell in the stack.

* * * * *

UNITED STATES PATENT AND TRADEMARK OFFICE
CERTIFICATE OF CORRECTION

PATENT NO. : 9,508,945 B2  
APPLICATION NO. : 13/929028  
DATED : November 29, 2016  
INVENTOR(S) : Russell J. Holmes, Richa Pandey and Stephen M. Menke Page 1 of 1

It is certified that error appears in the above-identified patent and that said Letters Patent is hereby corrected as shown below:

In the Claims

Column 16, Line 40, In Claim 12, after "material," delete "and".

Signed and Sealed this  
Third Day of July, 2018

Andrei Iancu  
*Director of the United States Patent and Trademark Office*